May 31, 1955 R. J. KIRCHER 2,709,787

SEMICONDUCTOR SIGNAL TRANSLATING DEVICE

Filed Sept. 24, 1953

INVENTOR
R. J. KIRCHER
BY

ATTORNEY 2,709,787

SEMICONDUCTOR SIGNAL TRANSLATING DEVICE

Reymond J. Kircher, Summit, N. J., assignor to Bell Telephone Laboratories, Incorporated, New York, N. Y., a corporation of New York Application September 24, 1953, Serial No. 382,169
5 Claims. (Cl. 332—52)

Figure 1:
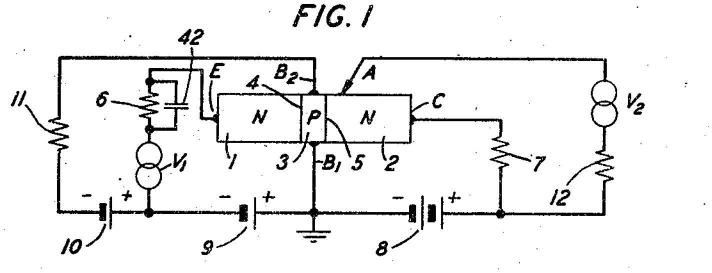

This invention relates to semiconductor signal translating devices and more particularly to such devices of the type now known as junction transistors.

Junction transistors, such as disclosed in Patent 2,569,347, granted September 15, 1951, to W. Shockley and discussed in the article by R. L. Wallace, Jr., and W. J. Pietenpol appearing in the Bell System Technical Journal, volume 30, July 1951, page 530 comprise, in general, a body of semiconductive material, for example germanium or silicon, having therein a zone of one conductivity type, that is N or P type, between and defining junctions with a pair of zones of the opposite conductivity type. Individual electrical connections are provided to the several zones. The intermediate zone is referred to commonly as the base zone, the outer zones as the emitter and collector zones respectively and the connections as the base, emitter and collector respectively.

In operation of such translators, in one manner, signals are impressed between the emitter and base. Amplified replicas of such signals are obtained at a load connected between the base and collector.

The performance characteristics of transistors, as is brought out in the article above identified and also in the application Serial No. 294,298, filed June 19, 1952, of R. L. Wallace, Jr., now Patent 2,695,930 issued November 30, 1954, are dependent upon or determinable by parameters associated with the base zone. For example, the stability and frequency range of operation are dependent markedly upon the base resistance, commonly designated $r_b$.

As disclosed in the application of R. L. Wallace, Jr., above identified, advantageous control of the parameters mentioned, and including the base resistance, can be effected by decreasing or varying the effective cross-sectional area of the emitter-base junction or this and the base-collector junction.

One general object of this invention is to facilitate control of the performance characteristics of transistors. More specifically, objects of this invention are to enable ready control of the performance determining parameters associated with the base zone in a junction transistor and to enhance the sensitivity of such control.

In accordance with one feature of this invention, in a junction transistor means are provided adjacent the collector or emitter junction for injecting charge carriers into the base zone thereby to vary or modulate a biasing current traversing this zone in the direction transverse to the flow of carriers across the emitter and collector junctions.

In one illustrative embodiment of this invention, the base zone is provided with terminals at points on opposite sides of the direction of carrier flow aforementioned and a source in series with an impedance is connected between these terminals to produce a biasing current through this zone. An auxiliary or control connection is made to the collector zone in proximity to the base-collector junction, for example by a point contact, and operated to inject minority type carriers in the region of the point contact, which are collected in the base region. These carriers are majority type in the base region. These carriers pass into the base zone contributing to the base current, whereby the biasing current aforementioned is varied accordingly. Signals applied to the control or auxiliary electrode thus effect modulation of the output of the transistor. As will be pointed out hereinafter, both amplitude and frequency modulation may be produced.

The auxiliary or control electrode together with the base and collector zones may be associated to constitute a transistor of the point emitter-junction collector type and operated as an amplifier. Thus, sensitive control of the base zone biasing current is obtainable.

Figure 2:
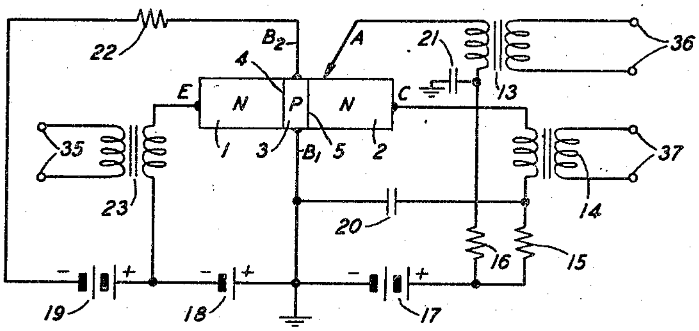
Figure 3:
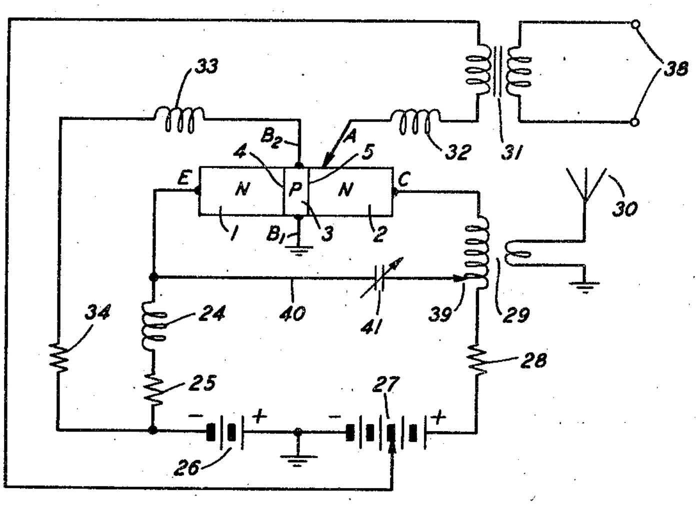

The invention and the above noted and other features thereof will be understood more clearly and fully from the following detailed description with reference to the accompanying drawing in which:

Fig. 1 is in part a diagram and in part a circuit schematic illustrating one embodiment of this invention;

Fig. 2 portrays a modulator illustrative of a further embodiment of this invention; and Fig. 3 depicts a modulated radio frequency oscillator illustrative of another embodiment of this invention.

Fig. 1 shows an N-P-N junction transistor having an emitter zone 1 and a collector zone 2, each of N-type material, and an intermediate thinner base zone 3, of P-type material. The latter forms an emitter junction 4 with the emitter zone 1 and a collector junction 5 with the collector zone 2. The device is provided with the customary emitter and collector connections E and C to the emitter and collector zones 1 and 2 respectively and with the normal and auxiliary base connections $B_1$, $B_2$ to the intermediate base zone 3. It is provided in addition with a point contact connection A to collector zone 2 in close proximity to collector junction 5 and to the surface to which $B_2$ connection is made. In a typical embodiment, in which electrode A injects hole carriers, the point contact may be made at about one mil distance from the junction 5. Thus, the control electrode is located in the N-type collector region close enough to the P region to enable the base region connecting to electrode $B_2$ to function as a collector by virtue of the bias voltage applied to $B_2$ relative to $B_1$.

In the grounded base configuration of Fig. 1, which may be employed as a mixer or converter, the normal base electrode $B_1$ may be connected to ground, while the emitter connection E is returned to it by way of a signal source $V_1$, a resistor 6 which may be by-passed by a condenser, 42, for the signal voltage, and a potential source 9 which applies a forward bias of appropriately small magnitude to the emitter junction. The collector connection C is returned to ground by way of a load indicated by the resistor 7 and a second potential source 8 which applies a larger and reverse bias to the collector junction.

The auxiliary base electrode $B_2$ may be biased more negatively than the emitter as by returning it to ground by way of the resistor 11 and the potential source 10. The bias battery 10 causes a bias current to flow in the base-to-base circuit.

The point contact electrode A may be returned to ground by way of the signal source $V_2$ which may include a separate or inherent D. C. resistance indicated by the resistor 12. As disclosed in the aforementioned application of R. L. Wallace, Jr., application of a negative bias to the auxiliary base electrode $B_2$ greatly reduces the effective cross-sectional area of the emitter junction 4, restricting it to that part of the junction which lies in the immediate vicinity of the normal base electrode $B_1$. In consequence of this action, the effective base resistance $r_b$ of the transistor is greatly reduced as compared with its magnitude in the absence of the auxiliary base electrode $B_2$ and its bias current. It is further shown in that application that this reduction of base resistance results in enhancement of high frequency operation of the transistor as an amplifier or oscillator.

Within the functional requirements of the device a wide range of circuit values may be employed. Thus, the potential of electrode A is positive with respect to electrodes $B_2$ and C. Collector electrode C in turn is positive with respect to electrodes E, $B_1$, and $B_2$. For a typical embodiment values may be assigned as follows: Electrode $B_1$ being grounded is assumed to be at zero potential. The potential source 9 may be a 1.5 volt battery which with the resistor 6 of 1,500 ohms would produce an emitter current of approximately 1 milliampere. An additional bias of 4.5 volts from the battery source 10 may be applied through a 10,000 ohm resistor 11 to produce a bias gradient from $B_2$ to $B_1$ which limits transistor operation for electron injection to a narrow junction region close to terminal $B_1$. The collector circuit may include a positive potential source 8 of 10 volts and a resistance 7, of 5,000 ohms. With the above-indicated emitter current and a D. C. resistance 12, associated with signal source $V_2$ of slightly lower value than that of the collector circuit, for example 4,800 ohms, connection C will be at 5 volts positive, electrode A at 5.2 volts positive, and $B_2$ at about 1 volt negative. The value for $B_2$ assumes a D. C. resistance across base zone 3 of 2,000 ohms.

The polarities of the potential sources shown in Fig. 1 are those appropriate for a transistor of N–P–N configuration. For a P–N–P transistor all polarities should be reversed.

The present invention is based in part upon the discovery that this enhancement of high frequency operation may be varied under the control of a signal applied to the control electrode A, arranged to inject suitable carriers into the region made inoperative by the foregoing design. The type of carriers injected will be minority carriers with respect to the collector zone and are therefore the same as the majority carriers of the intermediate zone 3. Thus, in the embodiment of Fig. 1, the point-contact A is made to collector zone 2 close to the collector junction 5 and in proximity to the high resistance region of the base zone 3 resulting from the reverse bias applied by auxiliary electrode $B_2$. The control electrode A may be arranged to inject hole carriers into the N-type collector zone 2 which carriers then flow through the collector junction 5 and are conducted to and collected by the electrode $B_2$. The base region near $B_2$ then functions as a collector. As set forth in the exemplary embodiment with electrode $B_2$ at 1 volt negative and point-contact A at 5.2 volts positive, hole carriers will be injected by contact A into a small region of N-type zone 2. The carriers thus injected will be drawn across the junction 5 into the intermediate zone 3 by the negatively biased electrode $B_2$. In the intermediate P-type zone 3 the hole carriers combine with the bias current so that variations in the injected carriers appear as a variation in the bias current. Thus, the minority carrier current flow injected by the signal $V_2$ serves to vary the current flowing in the base zone 3, thereby affecting the parameters of the N–P–N transistor comprising emitter zone 1, intermediate zone 3, and collector zone 2.

It may be noted that the control electrode connection may be of other rectifying types. For example, point contact A could be a welded point of suitable composition for an emitter point for the type of region on which it is placed. A beryllium copper point may be used for N germanium.

Hence the signal impressed from the source $V_2$ by way of the control electrode A effects a modulation of the exciting voltage signal from the source $V_1$. A highly sensitive modulation control may be attained with this unique structure comprising the point contact A, collector junction 5, and electrode $B_2$ which taken together constitute a transistor capable of producing voltage and power amplification.

In the embodiment of Fig. 2, the device of this invention is utilized in a modulator circuit. As in the embodiment of Fig. 1, there is provided an N–P–N junction transistor having a similar configuration of conductivity zones, junctions and terminals denoted by symbols identical to those of Fig. 1. As indicated, the normal base electrode $B_1$ may be connected to ground and the emitter electrode E is returned to ground by way of the potential source 18. An input signal voltage 35 which may be viewed as the carrier voltage may be impressed upon the emitter circuit by way of the transformer coupling 23.

The auxiliary base electrode is returned to ground by way of the resistor 22 and the potential source 19 which provides the appropriate bias current in the base-to-base circuit. Indicated in the collector return circuit is a potential source 17 applying an appropriate positive bias, a resistor 15, and a transformer coupling 14 to the output load circuit 37. A purely A. C. return is provided by the path containing the condenser 20.

The control electrode A is returned to ground by way of a resistor 16 and the potential source 17. The modulating input signal 36 may be impressed on this circuit by way of the transformer coupling 13. A ground return containing a blocking condenser 21 may be provided.

In the operation of this circuit, with the device of this invention functioning as described above, the output signal observed at the output terminals 37 will comprise the product of the amplified and translated carrier input 35 and the modulating input 36.

In the embodiments of Figs. 1 and 2, the principal effect is amplitude modulation of oscillations applied through the emitter circuit. However, another effect of the employement of the device of this invention alone or in conjunction with other circuit elements is to produce frequency modulation of impressed oscillations. This effect will be apparent from a consideration of the circuit of Fig. 3.

An N–P–N junction transistor is provided of identical configuration and symbols to those of the embodiments previously described. In addition to the potential sources 26 and 27 for appropriately biasing the various electrodes with respect to the grounded base $B_1$, there is provided a feedback loop 40 from the collector output circuit to the emitter input. Provision of a tuning condenser 41 and variable inductance 39 enables operation of this circuit as a local oscillator. A load circuit is indicated by the transformer coupled antenna 30. A modulating input 38, which may comprise a voice or tone signal or the like, is applied to the control electrode circuit by the transformer coupling 31. Radio frequency choke coils 24, 32 and 33 are preferably included to isolate the self-oscillating circuit from other alternating current sources.

While the input signal 38 impressed upon the control electrode A produces an amplitude modulation of the local oscillations there is caused additionally a frequency modulation. An input signal 38 applied as by a transformer 31 to the electrode A acts in the fashion discussed above to cause variations in the potential gradient of the base zone 3. In other words, the resistance $r_b$ of the base region varies as does the complex current amplification factor $\alpha$. In addition, the effect of carrier injection at A is to vary the potential across the collector junction 5 which varies the effecive ground capacitance of this junction. Both of these effects contribute effectively to modulation of the oscillation frequency. At low oscillation frequencies (e. g. 1,000 kilocycles per second) this frequency modulation is small, incidental and unimportant. However, when the frequency of oscillation is raised the magnitude of the frequency deviation is raised proportionately. Thus, at the higher frequencies of the order of 100 megacycles the device of this invention serves in and of itself as a reactive component for the production of frequency modulation output signals.

It is to be understood that the above-described arrangements are illustrative of the application of the principles of this invention. Numerous other arrangements may be devised by those skilled in the art without departing from the spirit and scope of this invention.

What is claimed is:

1. Signal translating apparatus which comprises a body of semiconductive material having therein a base zone of one conductivity type between and contiguous with emitter and collector zones of the opposite conductivity type, an input circuit connected between said emitter and base zones including means for applying an alternating current signal, an output circuit connected between said base and collector zones including a load, a biasing circuit connected between opposite points of said base zone including means for establishing a biasing current through said base zone in the direction transverse to the carrier path in said body between said emitter and collector zones, a control circuit connected between said base zone and said collector zone including an alternating current signal source.

2. Signal translating apparatus which comprises a body of semiconductive material having therein a base zone of one conductivity type between and contiguous with emitter and collector zones of the opposite conductivity type, an input circuit connected between said emitter and base zones including means for applying an alternating current signal, an output circuit connected between said base and collector zones including means for deriving an output signal therefrom, a biasing circuit connected between opposite points of said base zone including biasing means for establishing a current through said base zone in the direction transverse to the carrier path in said body between said emitter and collector zones, a control circuit connected between said base zone and a rectifying connection to said collector zone including means for applying a modulating input signal.

3. Signal translating apparatus which comprises a body of semiconductive material having therein a base zone of one conductivity type between and contiguous with emitter and collector zones of the opposite conductivity type, an input circuit connected between said emitter and base zones, a biasing circuit connected between opposite points of said base zone including biasing means for establishing a current through said base zone in the direction transverse to the carrier path in said body between said emitter and collector zones, a control circuit connected between said base zone and a rectifying connection to said collector zone, including means for applying a modulating signal, an output circuit between said collector and base zones including means for deriving an output signal from said collector connection, and means for feeding back a selected portion of said output signal to said emitter connection.

4. A signal translating device comprising a body of semiconductive material having therein a base zone of one conductivity type between and contiguous with emitter and collector zones of the opposite conductivity type, an input circuit connected between said emitter and base zones, an output circuit connected between said base and collector zones, means for establishing a biasing current through said base zone in the direction transverse to the carrier path in said body between said emitter and collector zones, and means for controlling said biasing current comprising a connection to said collector zone, said connection having rectifying characteristics.

5. A signal translating device comprising a body of semiconductive material having therein a base zone of one conductivity type between and contiguous with emitter and collector zones of the opposite conductivity type, an input circuit connected between said emitter and base zones, an output circuit connected between said base and collector zones, means for establishing a biasing current through said base zone in the direction transverse to the carrier path in said body between said emitter and collector zones, and means for controlling said biasing current comprising a connection to said collector zone at a point contiguous to said base zone, said connection having rectifying characteristics.

References Cited in the file of this patent

UNITED STATES PATENTS 2,657,360 Wallace -------------- Oct. 27, 1953